(12) United States Patent
Park et al.

(10) Patent No.: US 12,238,972 B2
(45) Date of Patent: Feb. 25, 2025

(54) DISPLAY DEVICE

(71) Applicant: Samsung Display Co., LTD., Yongin-si (KR)

(72) Inventors: Dong-Joon Park, Anyang-si (KR); Do Hyun Kang, Hwaseong-si (KR); Jung Kook Park, Cheonan-si (KR); Dong Hak Pyo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 364 days.

(21) Appl. No.: 17/571,521

(22) Filed: Jan. 9, 2022

(65) Prior Publication Data
US 2022/0328580 A1 Oct. 13, 2022

(30) Foreign Application Priority Data
Apr. 8, 2021 (KR) .................. 10-2021-0045907

(51) Int. Cl.
*H10K 59/122* (2023.01)
*H10K 50/86* (2023.01)
*H10K 59/35* (2023.01)

(52) U.S. Cl.
CPC ......... *H10K 59/122* (2023.02); *H10K 50/865* (2023.02); *H10K 59/353* (2023.02)

(58) Field of Classification Search
CPC .. H10K 59/122; H10K 59/353; H10K 59/352; H10K 59/50; H10K 59/12; H10K 59/121; H10K 59/123; H10K 50/865; H10K 50/844; H10K 50/86
See application file for complete search history.

(56) References Cited

U.S. PATENT DOCUMENTS

| | | | |
|---|---|---|---|
| 8,610,847 B2 | 12/2013 | Jung | |
| 9,692,018 B2 | 6/2017 | Cho et al. | |
| 10,347,700 B2 * | 7/2019 | Yang | H10K 59/40 |
| 2014/0307141 A1 * | 10/2014 | Tanaka | H04N 25/583 |
| | | | 348/281 |
| 2017/0212633 A1 | 7/2017 | You et al. | |
| 2022/0093708 A1 * | 3/2022 | Cho | G06F 3/0443 |

FOREIGN PATENT DOCUMENTS

| | | |
|---|---|---|
| KR | 10-2011-0088142 | 8/2011 |
| KR | 10-2016-0031108 | 3/2016 |
| KR | 10-2017-0089328 | 8/2017 |
| KR | 10-2017-0113822 | 10/2017 |
| KR | 10-1787978 | 10/2017 |
| KR | 10-2019-0080312 | 7/2019 |

OTHER PUBLICATIONS

Korean Office Action for Korean Patent Application No. 10-2021-0045907, dated Jan. 13, 2025.

* cited by examiner

*Primary Examiner* — Changhyun Yi
(74) *Attorney, Agent, or Firm* — KILE PARK REED & HOUTTEMAN PLLC

(57) ABSTRACT

A display device includes: a substrate; a pixel defining layer disposed on the substrate and that includes a pixel opening; an emission layer that overlaps the pixel opening of the pixel defining layer; and an anti-reflection layer that overlaps the pixel defining layer along a direction perpendicular to a surface of the substrate and is disposed along a portion of an edge of the pixel opening.

20 Claims, 11 Drawing Sheets

DISPLAY DEVICE

CROSS-REFERENCE TO RELATED APPLICATION

This application claims priority from and the benefit of Korean Patent Application No. 10-2021-0045907, filed on Apr. 8, 2021, which is hereby incorporated by reference for all purposes as if fully set forth herein.

BACKGROUND

Field

Embodiments of the invention generally relate to a display device.

Discussion of the Background

Flat display devices include a liquid crystal display (LCD), a plasma display panel (PDP), an organic light emitting diode (OLED) device, a field effect display (FED), an electrophoretic display device, and the like.

The display devices are used in various electronic devices such as a mobile phone, a navigation device, a digital camera, an electronic book, a portable game machine, and various terminals.

On the other hand, when a display device like a navigation system is used in a vehicle, an image displayed by the display device may be reflected onto a windshield of the vehicle to obstruct the driver's view.

The above information disclosed in this Background section is only for enhancement of understanding of the background of the invention, and therefore it may contain information that does not form the prior art that is already known in this country to a person of ordinary skill in the art.

The above information disclosed in this Background section is only for understanding of the background of the inventive concepts, and, therefore, it may contain information that does not constitute prior art.

SUMMARY

Devices constructed according to illustrative implementations of the invention are capable of preventing light from being reflected to an undesired angle with respect to a display device.

Embodiments are to provide a display device that may prevent an image displayed on the display device from being reflected to an undesired area so as to be unnecessarily viewed.

Additional features of the inventive concepts will be set forth in the description which follows, and in part will be apparent from the description, or may be learned by practice of the inventive concepts.

It is obvious that the object of the present invention is not limited to the above-described object, and may be variously extended without departing from the scope of the present invention.

An embodiment provides a display device including: a substrate; a pixel defining layer disposed on the substrate and including a pixel opening; an emission layer that overlaps the pixel opening of the pixel defining layer; and an anti-reflection layer that overlaps the pixel defining layer along a direction perpendicular to a surface of the substrate and is disposed along a portion of an edge of the pixel opening.

The anti-reflection layer may be disposed in a first direction with respect to the pixel opening, and the anti-reflection layer may not be disposed in a second direction opposite to the first direction with respect to the pixel opening.

The pixel defining layer may include a plurality of the pixel openings, and a second width of the anti-reflection layer may be smaller than a first width of the pixel defining layer between two adjacent pixel openings among the plurality of pixel openings, along a direction parallel to the first direction.

A width of the anti-reflection layer may be substantially equal to or smaller than a width of the pixel opening, along a direction perpendicular to the first direction.

Light emitted from the emission layer toward the first direction may be blocked by the anti-reflection layer to not be emitted to the outside of the display device.

Light emitted from the emission layer toward the second direction may not be blocked by the anti-reflection layer to be emitted to the outside of the display device.

The display device may further include a first anti-reflection layer that overlaps the anti-reflection layer along a direction perpendicular to the surface of the substrate and is disposed along the portion of the edge of the pixel opening.

A first portion of the light emitted from the emission layer toward the first direction may be blocked by the anti-reflection layer to not be emitted to an outside of the display device, and a second portion of the light emitted from the emission layer toward the first direction may not be blocked by the anti-reflection layer, but is blocked by the first anti-reflection layer to not be emitted to the outside of the display device.

The display device may further include: a transistor disposed on the substrate; a pixel electrode connected to the transistor and disposed under the pixel defining layer; a common electrode disposed on the emission layer; and an encapsulation layer disposed on the common electrode, wherein the anti-reflection layer may be disposed on the encapsulation layer.

The display device may further include a first anti-reflection layer that is disposed on the anti-reflection layer, overlaps the anti-reflection layer along the direction perpendicular to the surface of the substrate, and is disposed along the portion of the edge of the pixel opening.

The display device may further include: a first layer disposed between the encapsulation layer and the anti-reflection layer; a second layer disposed on the anti-reflection layer; and a third layer disposed between the second layer and the first anti-reflection layer, wherein a thickness of the third layer measured along the direction perpendicular to the surface of the substrate may be thicker than a thickness of the first layer measured along the direction perpendicular to the surface of the substrate.

Along a direction parallel to the first direction, a second width of the anti-reflection layer and a third width of the first anti-reflection layer may be smaller than a first width of the pixel defining layer.

The second width and the third width may be the same, or the third width may be larger than the second width.

Another embodiment provides a display device including: a first pixel group that includes a plurality of pixel openings, a plurality of emission layers that overlap the plurality of pixel openings, and a plurality of anti-reflection layers disposed along a portion of an edge of each of the plurality of pixel openings; and a second pixel group that includes the plurality of pixel openings and the plurality of emission layers that overlap the plurality of pixel openings, but does not include the plurality of anti-reflection layers, wherein the first pixel group and the second pixel group may be alternately disposed along a first direction.

Both the plurality of emission layers of the first pixel group and the plurality of emission layers of the second pixel group may emit light in a first case, while the plurality of emission layers of the first pixel group may emit light in a second case, and the plurality of emission layers of the second pixel group may not emit light in the second case.

Surroundings of the display device may be darker in the second case than the first case.

According to the display device of the embodiments, it is possible to prevent an image displayed on the display device from being reflected to be unnecessarily viewed.

It is obvious that the effect of the present invention is not limited to the above-described effects, and may be variously extended without departing from the scope of the present invention.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
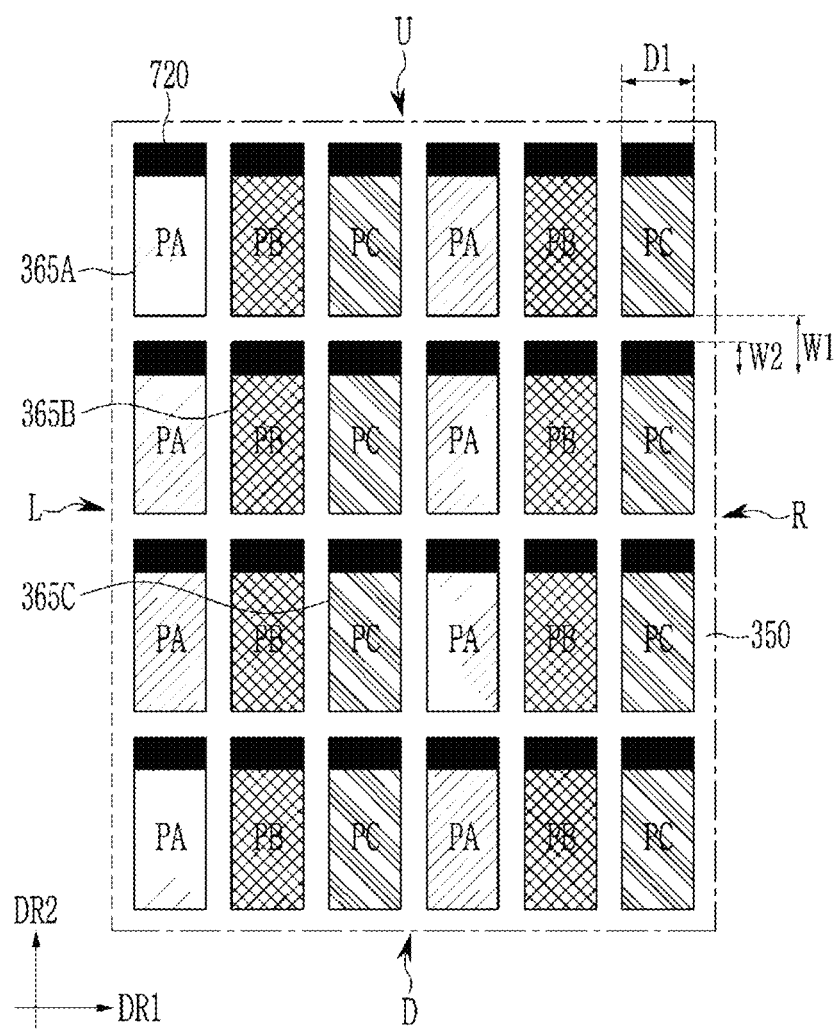
FIG. 1 illustrates a layout view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will be described more fully hereinafter with reference to the accompanying drawings, in which embodiments of the invention are shown. As those skilled in the art would realize, the described embodiments may be modified in various different ways, all without departing from the scope of the present invention.

In order to clearly describe the present invention, parts that are irrelevant to the description are omitted for ease in explanation of the various embodiments described hereinbelow, and identical or similar constituent elements throughout the specification are denoted by the same reference numerals.

Further, in the drawings, the size and thickness of each element are arbitrarily illustrated for ease of description, and the embodiments described hereinbelow are not necessarily limited to those illustrated in the drawings. In the drawings, the thicknesses of layers, films, panels, regions, areas, etc., are exaggerated for clarity. Also, in the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" connotes being positioned on or below the object portion, and does not necessarily connote being positioned on the upper side of the object portion based on a gravitational direction.

Further, throughout the specification, the phrase "in a plan view" or "on a plane" connotes viewing a target portion from the top, and the phrase "in a cross-sectional view" or "on a cross-section" connotes viewing a cross-section formed by vertically cutting a target portion from the side.

Furthermore, throughout the specification, "connected" does not only denote when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other.

A display device according to an embodiment will be described with reference to FIG. 1 to FIG. 3. FIG. 1 illustrates a layout view of a display device according to an embodiment that is constructed according to principles of the invention, FIG. 2 conceptually illustrates a position of a display device according to an embodiment, and FIG. 3 illustrates a partially cross-sectional view of a pixel of a display device according to an embodiment.

Referring to FIG. 1, a display device 100 according to an embodiment includes a plurality of pixels PA, PB, and PC, and an anti-reflection layer 720.

The plurality of pixels PA, PB, and PC may be disposed in a matrix format along a first direction DR1 and a second direction DR2 that is orthogonal to, or substantially orthogonal to, the first direction DR1.

The plurality of pixels PA, PB, and PC include a plurality of first pixels PA, a plurality of second pixels PB, and a plurality of third pixels PC, which display different colors. The plurality of first pixels PA, the plurality of second pixels PB, and the plurality of third pixels PC may be repeatedly disposed sequentially in the first direction DR1. The plurality of first pixels PA may be disposed in a line along the second direction DR2, the plurality of second pixels PB may be disposed in a line along the second direction DR2, and the plurality of third pixels PC may be disposed in a line along the second direction DR2. However, the arrangement of the plurality of pixels PA, PB, and PC is not limited thereto, and it is obvious that various changes are possible.

The first direction DR1 is a direction crossing a first surface L and a second surface R of the display device 100 and may be a direction parallel to a direction toward the first surface L or toward the second surface R, and the second direction DR2 is a direction crossing a third surface U and a fourth surface D of the display device and may be a direction parallel to a direction toward the third surface U or toward the fourth surface D.

A plurality of pixel openings 365A, 365B, and 365C in which an emission layer displaying an image is positioned in the plurality of pixels PA, PB, and PC may be defined by a pixel defining layer 350. Specifically, the pixel defining layer 350 may be disposed on an entire surface of the display device, the plurality of pixel openings 365A, 365B, and 365C are formed in the pixel defining layer 350, and the emission layer is disposed so as to overlap an area in which the plurality of pixel openings 365A, 365B, and 365C are formed, so that an image may be displayed in the plurality of pixel openings 365A, 365B, and 365C.

The plurality of pixel openings 365A, 365B, and 365C may include a plurality of first pixel openings 365A, a plurality of second pixel openings 365B, and a plurality of third pixel openings 365C, and the plurality of first pixel openings 365A may define emission areas of the plurality of first pixels PA, the plurality of second pixel openings 365B may define emission areas of the plurality of second pixels PB, and the plurality of third pixel openings 365C may define emission areas of the plurality of third pixels PC.

A plurality of anti-reflection layers 720 may block light. For example, the plurality of anti-reflection layers 720 may include black color pigments, and may absorb incident light to prevent it from being emitted to the outside of the display device.

The plurality of anti-reflection layers 720 may be disposed so as to overlap a portion of the pixel defining layer 350, and disposed along an edge disposed at the third surface U side of the display device among edges of the plurality of pixel openings 365A, 365B, and 365C.

A width D1 of each anti-reflection layer 720 measured along the first direction DR1 may be substantially equal to or smaller than a width of each pixel opening measured along the first direction DR1.

A second width W2 measured along the second direction DR2 of each anti-reflection layer 720 may be smaller than a first width W1 measured along the second direction DR2 of the pixel defining layer 350 disposed between the pixel openings of two pixels adjacent to each other along the second direction DR2, and for example, between two first pixel openings 365A, two second pixel openings 365B, and two third pixel openings 365C.

Figure 2:
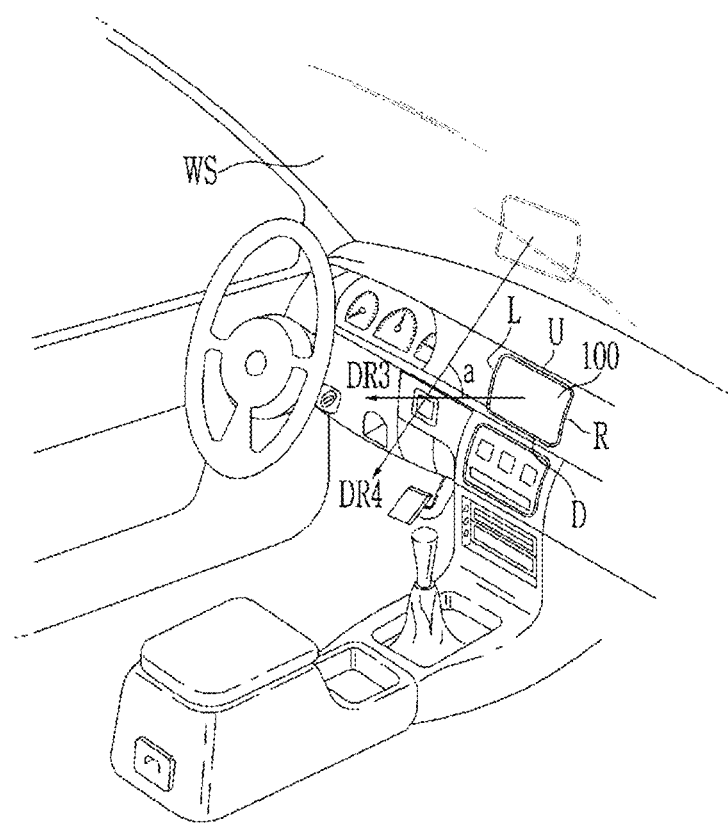
FIG. 2 conceptually illustrates a position of a display device according to an embodiment.
Figure 3:
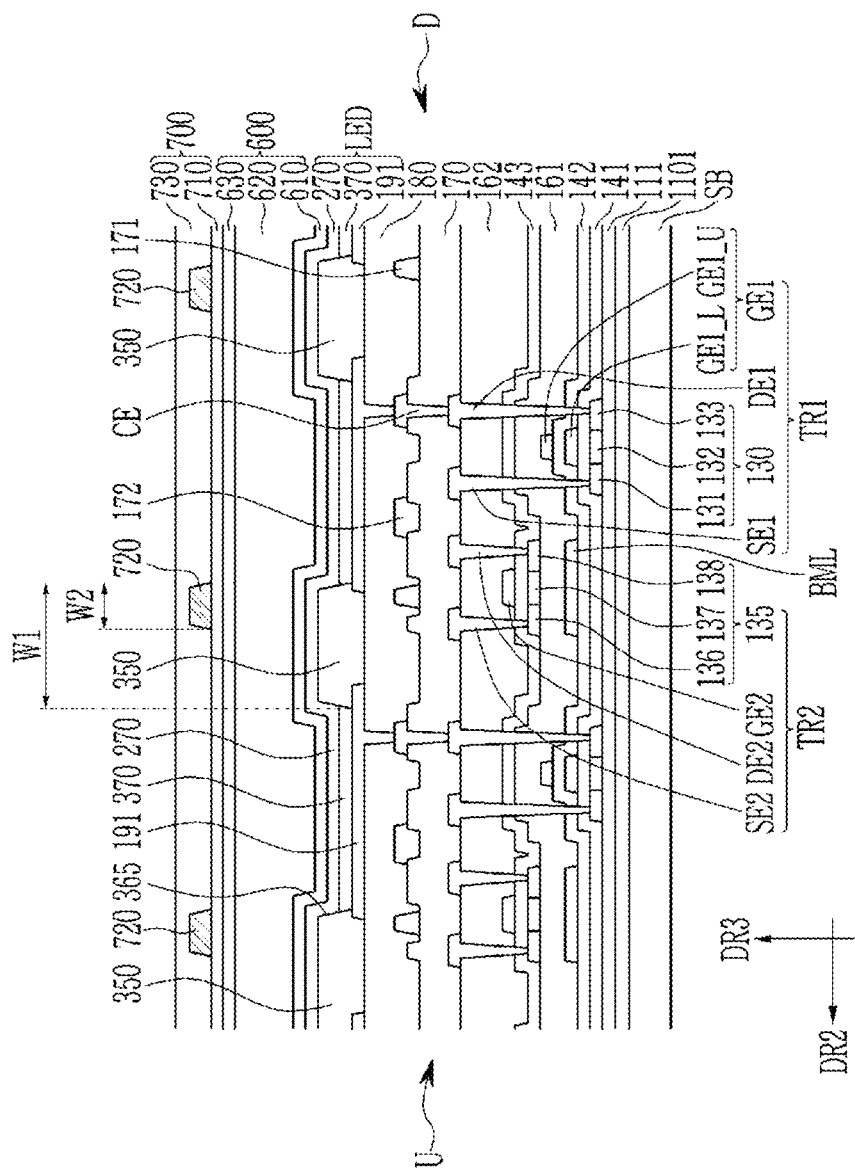
FIG. 3 illustrates a partial cross-sectional view of a pixel of a display device according to an embodiment.

Referring to FIG. 2, the display device 100 may be disposed adjacent to a reflecting portion WS. For example, the display device 100 may be disposed inside the vehicle, the windshield may be disposed above the display device 100, and the windshield of the vehicle may be the reflecting portion WS from which the image displayed by the display device 100 is reflected.

More specifically, the reflecting portion WS may be disposed at the third surface U side of the display device 100. A third direction DR3 perpendicular to a surface of the display device 100 and a fourth direction DR4 perpendicular to a surface of the reflecting portion WS are not parallel to each other, and may form a predetermined angle (a).

Some of light emitted from the display device 100 may be reflected by the reflecting portion WS to be viewed, and particularly, when the surrounding thereof is dark, the reflected image may be easily viewed.

More specifically, the light emitted from the display device 100 toward the third surface U of the display device 100 is reflected by the reflecting portion WS that is inclined so as to form the predetermined angle (a) with the third direction DR3, and the reflected light may be viewed from the outside. Particularly, when the surroundings are dark, the reflected light reflected by the reflecting portion WS may be easily viewed, thereby obstructing the user's view, such as a driver's view.

However, according to the display device according to the embodiment, the plurality of anti-reflection layers 720 may be disposed so as to overlap a portion of the pixel defining layer 350 along an edge disposed at the third surface U side of the display device among edges of the plurality of pixel openings 365A, 365B, and 365C, and accordingly, the light emitted from the display device 100 toward the third surface U may be blocked and/or refracted/reflected by the plurality of anti-reflection layers 720 to prevent it from being reflected by the reflecting portion WS. This will be described in more detail later.

Hereinafter, an interlayer structure of the display device according to the embodiment will be described with reference to FIG. 3 along with FIG. 1. According to the embodiment shown in FIG. 3, for better comprehension and ease of description, a first transistor TR1, a second transistor TR2, and a light emitting diode LED connected to the second transistor TR2 are mainly illustrated, but the embodiment is not limited thereto, and other transistors may be included in addition to the first transistor TR1 and the second transistor TR2.

Referring to FIG. 3, a barrier layer 1101 may be disposed on a substrate SB.

The substrate SB may include an insulating material such as a polymer such as a polyimide and a polyamide or glass, and may be optically transparent. The substrate SB may include a plurality of layers overlapping each other.

The barrier layer 1101 serves to flatten a surface while simultaneously preventing unnecessary components such as impurities or moisture from penetrating. The barrier layer 1101 may include at least one of a silicon oxide, a silicon nitride, a silicon oxynitride, and an amorphous silicon.

A buffer layer 111 may be disposed on the barrier layer 1101. The buffer layer 111 may be disposed between the substrate SB and a first semiconductor 130 to block impurities from the substrate SB during a crystallization process to form polycrystalline silicon, thereby improving characteristics of the polycrystalline silicon.

The buffer layer 111 may include an inorganic insulating material such as a silicon oxide ($SiO_X$), a silicon nitride ($SIN_X$), and a silicon oxynitride ($SiO_XN_Y$). The buffer layer 111 may include amorphous silicon (Si).

The first semiconductor 130 may be disposed on the buffer layer 111. The first semiconductor 130 may include a polycrystalline silicon material. That is, the first semiconductor 130 may be formed of a polycrystalline semiconductor. The first semiconductor 130 may include a source region 131, a channel region 132, and a drain region 133.

The source region 131 of the first semiconductor 130 may be connected to a first source electrode SE1, and the drain region 133 of the first semiconductor 130 may be connected to a first drain electrode DE1.

A first gate insulating film 141 may be disposed on the first semiconductor 130. The first gate insulating film 141 may have a single-layered or multi-layered structure including a silicon nitride, a silicon oxide, a silicon oxynitride, and the like.

A first gate lower electrode GE1_L may be disposed on the first gate insulating film 141. The first gate lower electrode GE1_L may include molybdenum (Mo), aluminum (Al), copper (Cu), and/or titanium (Ti), and may have a single-layered or multi-layered structure including these elements.

A second gate insulating film 142 may be disposed on the first gate lower electrode GE1_L. The second gate insulating film 142 may include a silicon nitride, a silicon oxide, a silicon oxynitride, and the like. The second gate insulating film 142 may have a single-layered or multi-layered structure including a silicon nitride, a silicon oxide, a silicon oxynitride, and the like.

A first gate upper electrode GE1_U may be disposed on the second gate insulating film 142. The first gate lower electrode GE1_L and the first gate upper electrode GE1_U may overlap each other with the second gate insulating film 142 therebetween. The first gate upper electrode GE1_U and the first gate lower electrode GE1_L form a first gate electrode GE1. The first gate electrode GE1 may overlap the channel region 132 of the first semiconductor 130 in a direction perpendicular to the substrate SB.

The first gate upper electrode GE1_U and a gate line may include molybdenum (Mo), aluminum (Al), copper (Cu) silver (Ag), chromium (Cr), tantalum (Ta), or titanium (Ti), and may have a single-layered or multi-layered structure including these elements.

A metal layer BML formed of the same layer as the first gate upper electrode GE1_U and the gate line may be disposed on the second gate insulating film 142, and the metal layer BML may overlap the second transistor to be described later in more detail. The metal layer BML may be connected to a driving voltage line, or a gate electrode or a source electrode of the second transistor TR2, to serve as the lower gate electrode.

The first semiconductor 130, the first gate electrode GE1, the first source electrode SE1, and a first drain electrode DE1 form the first transistor TR1. The first transistor TR1 may be a driving transistor connected to a light emitting diode LED, and may be formed as a transistor including a polycrystalline semiconductor.

A first interlayer insulating film 161 may be disposed on the first gate electrode GE1. The first interlayer insulating film 161 may include a silicon nitride, a silicon oxide, a silicon oxynitride, or the like. The first interlayer insulating film 161 may be formed as a multilayer in which a layer containing a silicon nitride and a layer containing a silicon oxide are stacked. In this case, the layer containing a silicon nitride may be disposed closer to the substrate SB than the layer containing a silicon oxide in the first interlayer insulating layer 161.

A second semiconductor 135 may be disposed on the first interlayer insulating layer 161. The second semiconductor 135 may overlap the metal layer BML.

The second semiconductor 135 may include an oxide semiconductor. The oxide semiconductor may include at least one of an indium (In) oxide, a tin (Sn) oxide, a zinc (Zn) oxide, a hafnium (Hf) oxide, and an aluminum (Al) oxide. For example, the second semiconductor 135 may include an indium-gallium-zinc oxide (IGZO).

The second semiconductor 135 may include a channel region 137, and a source region 136 and a drain region 138 disposed at respective sides of the channel region 137. The source region 136 of the second semiconductor 135 may be connected to a second source electrode SE2, and the drain region 138 of the second semiconductor 135 may be connected to a second drain electrode DE2.

A third gate insulating film 143 may be disposed on the second semiconductor 135. The third gate insulating film 143 may include a silicon nitride, a silicon oxide, a silicon oxynitride, or the like.

In the embodiment as shown in FIG. 3, the third gate insulating film 143 may be entirely disposed on the second semiconductor 135 and the first interlayer insulating film 161. Accordingly, the third gate insulating film 143 may cover upper and lateral surfaces of the source region 136, the channel region 137, and the drain region 138 of the second semiconductor 135.

When the third gate insulating film 143 does not cover the upper surfaces of the source region 136 and the drain region 138, some material of the second semiconductor 135 may move to the lateral surface of the third gate insulating film 143. In the embodiment, since the third gate insulating film 143 is disposed on the entire surface of the second semiconductor 135 and the first interlayer insulating film 161, a short circuit between the second semiconductor 135 and a second gate electrode GE2 due to diffusion of metal particles may be prevented.

However, the embodiments described herein are not limited thereto, and the third gate insulating film 143 may not be disposed on the entire surface of the second semiconductor 135 and the first interlayer insulating film 161. For example, the third gate insulating film 143 may be disposed only between the second gate electrode GE2 and the second semiconductor 135. That is, the third gate insulating film 143 may overlap the channel region 137 of the second semiconductor 135, and may not overlap the source region 136 and the drain region 138 of the second semiconductor 135. Through this, a length of the semiconductor channel may be reduced in a process of realizing high resolution.

The second gate electrode GE2 may be disposed on the third gate insulating film 143.

The second gate electrode GE2 may overlap the channel region 137 of the second semiconductor 135 in a direction perpendicular to the substrate SB. The second gate electrode GE2 may include molybdenum (Mo), aluminum (Al), copper (Cu), and/or titanium (Ti), and may have a single-layered or multi-layered structure including them. For example, the second gate electrode GE2 may include a lower layer containing titanium and an upper layer containing molybdenum, and the lower layer containing titanium may prevent diffusion of fluorine (F), which is an etching gas, during dry-etching of the upper layer.

The second semiconductor 135, the second gate electrode GE2, the second source electrode SE2, and the second drain electrode DE2 form the second transistor TR2. The second transistor TR2 may be formed as a transistor including an oxide semiconductor.

A second interlayer insulating film 162 may be disposed on the first gate electrode GE1. The second interlayer insulating film 162 may include a silicon nitride, a silicon oxide, a silicon oxynitride, or the like. The second interlayer insulating film 162 may be formed as a multilayer in which a layer containing a silicon nitride and a layer containing a silicon oxide are stacked.

The first source electrode SE1 and the first drain electrode DE1, and the second source electrode SE2 and the second drain electrode DE2, may be disposed on the second interlayer insulating film 162. The first source electrode SE1, the first drain electrode DE1, the second source electrode SE2, and the second drain electrode DE2 may include aluminum (Al), molybdenum (Mo), titanium (Ti), tungsten (W), and/or copper (Cu), and may have a single-layered or multi-layered structure including them. For example, the first source electrode SE1, the first drain electrode DE1, the second source electrode SE2, and the second drain electrode DE2 may have a triple-layered structure that includes a lower film containing a refractory metal such as titanium, molybdenum, chromium, and tantalum, or an alloy thereof, an interlayer film containing an aluminum-based metal, a silver-based metal, and a copper-based metal with low resistivity, and an upper film containing a refractory metal such as titanium, molybdenum, chromium, and tantalum.

The first source electrode SE1 may be connected to the source region 131 of the first semiconductor 130, and the first drain electrode DE1 may be connected to the drain region 133 of the first semiconductor 130.

The second source electrode SE2 may be connected to the source region 136 of the second semiconductor 135, and the second drain electrode DE2 may be connected to the drain region 138 of the second semiconductor 135.

A first insulating layer 170 may be disposed on the first source electrode SE1, the first drain electrode DE1, the second source electrode SE2, and the second drain electrode DE2. The first insulating layer 170 may be an organic film or an inorganic film. For example, the first insulating layer 170 may include an organic insulating material such as a general purpose polymer such as poly(methyl methacrylate) (PMMA) or polystyrene (PS), a polymer derivative having a phenolic group, an acryl-based polymer, an imide-based polymer, a polyimide, an acryl-based polymer, and a siloxane-based polymer.

A connection electrode CE, a data line 171, and a driving voltage line 172 may be disposed on the first insulating layer 170. The connection electrode CE and the data line 171 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including one or more of these elements.

The connection electrode CE may be connected to the second drain electrode DE2.

A second insulating layer 180 may be disposed on the first insulating layer 170, the connection electrode CE, and the data line 171. The second insulating layer 180 may serve to eliminate and flatten a step to increase light emitting efficiency of an emission layer to be formed thereon. The second insulating layer 180 may include an organic insulating material such as a general purpose polymer such as poly(methyl methacrylate) (PMMA) or polystyrene (PS), a polymer derivative having a phenolic group, an acryl-based polymer, an imide-based polymer, a polyimide, an acryl-based polymer, and a siloxane-based polymer A pixel electrode 191 may be disposed on the second insulating layer 180. The pixel electrode 191 may be connected to the second drain electrode DE2 through a contact hole of the second insulating layer 180.

The pixel electrode 191 may be individually disposed for each pixel PX. The pixel electrode 191 may contain a metal such as silver (Ag), lithium (Li), calcium (Ca), aluminum (Al), magnesium (Mg), or gold (Au), and may also contain a transparent conductive oxide (TCO) such as an indium tin oxide (ITO) or an indium zinc oxide (IZO). The pixel electrode 191 may be formed as a single layer including a metal material or a transparent conductive oxide, or a multilayer including them. For example, the pixel electrode 191 may have a triple-layered structure of an indium tin oxide (ITO)/silver (Ag)/an indium tin oxide (ITO).

A pixel defining layer 350 may be disposed on the pixel electrode 191. The pixel defining layer 350 may include an organic insulating material such as a general purpose polymer such as poly(methyl methacrylate) (PMMA) or polystyrene (PS), a polymer derivative having a phenolic group, an acryl-based polymer, an imide-based polymer, a polyimide, an acryl-based polymer, and a siloxane-based polymer. The pixel defining layer 350 may contain a black dye to not transmit light.

A pixel opening 365 including a plurality of pixel openings 365A, 365B, and 365C may be formed in the pixel defining layer 350, and the pixel opening 365 of the pixel defining layer 350 may overlap the pixel electrode 191. An emission layer 370 may be disposed in the pixel opening 365 of the pixel defining layer 350.

The emission layer 370 may include a material layer that uniquely emits light of basic colors such as red, green, and blue. The emission layer 370 may have a structure in which a plurality of material layers emitting light of different colors are stacked.

For example, the emission layer 370 may be an organic emission layer, and the organic emission layer may be a plurality of layers including one or more of a hole-injection layer (HIL), a hole-transporting layer (HTL), an electron-transporting layer (ETL), and an electron-injection layer (EIL). When the organic emission layer includes all of these, the hole-injection layer may be disposed on the pixel electrode 191, which is an anode electrode, and the hole-transporting layer, the emission layer, the electron-transporting layer, and the electron-injection layer may be sequentially stacked thereon.

A common electrode 270 may be disposed on the emission layer 370 and the pixel defining layer 350. The common electrode 270 may be commonly disposed for all pixels PX, and may receive a common voltage.

The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or a transparent conductive oxide (TCO) such as an indium tin oxide (ITO) or an indium zinc oxide (IZO).

The pixel electrode 191, the emission layer 370, and the common electrode 270 may form the light emitting diode LED. Here, the pixel electrode 191 may be an anode, which is a hole-injection electrode, and the common electrode 270 may be a cathode, which is an electron-injection electrode. However, the embodiment is not necessarily limited thereto, and the pixel electrode 191 may be a cathode and the common electrode 270 may be an anode, according to a driving method of the OLED display.

Holes and electrons are injected into the emission layer 370 from the pixel electrode 191 and the common electrode 270, respectively, and light is emitted when excitons in which the injected holes and electrons are combined enter a ground state from an excited state.

The first transistor TR1, which is the driving transistor of the display device according to the embodiment, may include a polycrystalline semiconductor, and the second transistor TR2, such as a compensation transistor or an initialization transistor, may include an oxide semiconductor. For high-speed driving, motion of a motion picture may be more naturally displayed by increasing an existing frequency of about 60 Hz to about 120 Hz, but this increases power consumption. To compensate for the increased power consumption, it is possible to decrease a frequency when driving a still image. For example, when a still image is driven, it may be driven at about 1 Hz. As such, when the frequency is lowered, a leakage current may occur. In the display device according to the embodiment, the leakage current may be minimized by making the second transistor TR2, such as a compensation transistor or an initialization transistor, include an oxide semiconductor. In addition, by making the first transistor TR1, which is a driving transistor, include a polycrystalline semiconductor, high electron mobility may be achieved. That is, by making the driving transistor and the switching transistor include different semiconductor materials, they may be more stably driven, and may have high reliability.

One pixel may include a plurality of transistors, and the plurality of transistors may include a switching transistor, a compensation transistor, an initialization transistor, two light-emitting transistors connected to each other, and a bypass transistor in addition to the driving transistor TR1. The second transistor TR2 described above may be a compensation transistor or an initialization transistor. The plurality of transistors may include an oxide transistor including an oxide semiconductor and a polycrystalline transistor including a polycrystalline semiconductor. For example, the compensation transistor and the initialization transistor, which are the second transistor TR2 described above, may be formed as oxide transistors, and the driving transistor TR1, the switching transistor, the light-emitting transistor, and the bypass transistor may be formed as silicon transistors. However, the embodiments described herein are not limited thereto, and the plurality of transistors may all be formed as silicon transistors.

An encapsulation layer 600 may be disposed on the common electrode 270. The encapsulation layer 600 may cover not only an upper surface of the display part but also a lateral surface of the display part to seal the display part.

The encapsulation layer 600 may include a plurality of layers, and may be formed as a composite layer including both an inorganic layer and an organic layer. For example, the encapsulation layer 600 may be formed as a triple layer in which a first encapsulation inorganic film 610, an encapsulation organic film 620, and a second encapsulation inorganic film 630 are sequentially formed.

An anti-reflection portion 700 may be disposed on the encapsulation layer 600.

The anti-reflection portion 700 may include a first layer 710 disposed on the encapsulation layer 600, a plurality of anti-reflection layers 720 disposed on the first layer 710, and a second layer 730 disposed on the plurality of anti-reflection layers 720.

The first layer 710 of the anti-reflection portion 700 may include at least one of a silicon nitride, a silicon oxide, and a silicon oxynitride. The first layer 710 may prevent components of the plurality of anti-reflection layers 720 formed thereon from being introduced into the encapsulation layer 600, and may planarize an area in which the plurality of anti-reflection layers 720 are to be formed.

The anti-reflection layer 720 of the anti-reflection portion 700 may block and/or reflect/refract light. For example, the anti-reflection layer 720 of the anti-reflection portion 700 may include black color pigments, and may absorb incident light to prevent it from being emitted to the outside.

The anti-reflection layer 720 of the anti-reflection portion 700 may overlap a portion of the pixel defining layer 350 along the third direction DR3 perpendicular to the surface of the substrate SB. A second width W2 measured along the second direction DR2 of each anti-reflection layer 720 may be smaller than the first width W1 measured along the second direction DR2 of the pixel defining layer 350 disposed between two adjacent pixel openings 365 along the second direction DR2.

As described above with reference to FIG. 1, in a plan view, the anti-reflection layer 720 of the anti-reflection portion 700 may be disposed so as to overlap the pixel defining layer 350 along the edge disposed at the third surface U side of the display device 100 among the edges of the pixel opening 365.

In a plan view, the anti-reflection layer 720 may not be disposed at a portion adjacent to the edge disposed at the fourth surface D side of the display device 100 among the edges of the pixel opening 365, and similarly, the anti-reflection layer 720 may not be disposed at a portion adjacent to the edge disposed at the first surface L side and the second surface R side of the display device 100 among the edges of the pixel opening 365.

The second layer 730 disposed on the anti-reflection layer 720 of the anti-reflection portion 700 may be a cover layer covering and protecting the plurality of anti-reflection layers 720.

Figure 4:
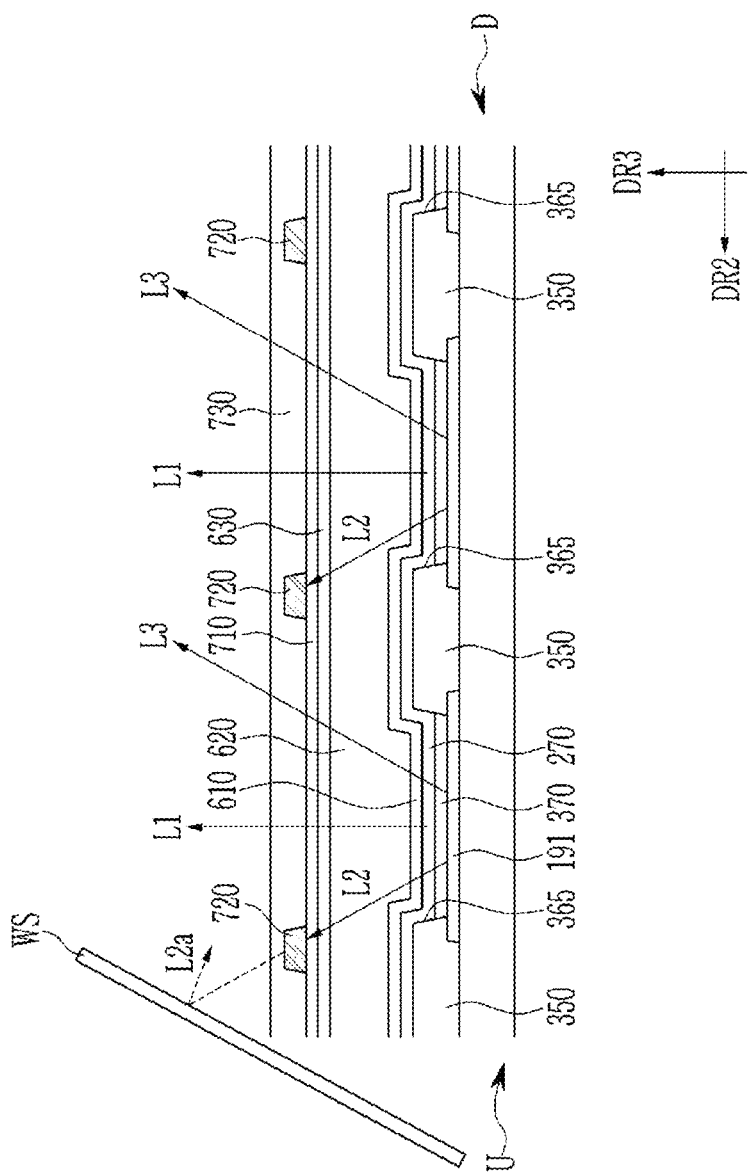
FIG. 4 illustrates a cross-sectional view for explaining a light path of a display device according to an embodiment.

Hereinafter, a light path of the display device according to an embodiment will be described with reference to FIG. 4 along with FIG. 1 to FIG. 3. FIG. 4 illustrates a cross-sectional view for explaining a light path of a display device according to an embodiment.

Referring to FIG. 4 along with FIG. 1 to FIG. 3, first light L1 emitted from the emission layer 370 toward the third direction DR3 is emitted to the outside of the display device, while second light L2 emitted from the emission layer 370 toward the third surface U of the display device 100 may be at least partially blocked (and/or reflected/refracted) by the anti-reflection layer 720 to not be emitted in a direction toward the third surface U.

When the second light L2 emitted from the emission layer 370 toward the third surface U of the display device 100 is not blocked by the anti-reflection layer 720 and is emitted to the outside of the display device like the first light L1 and third light L3, the second light L2 emitted to the outside of the display device is reflected from the reflecting portion WS disposed at an angle to form a predetermined angle with the third direction DR3 at the third surface U side of the display device 100, for example, is reflected from the windshield of the vehicle, so that it may form reflected light L2a to be viewed by the user. Particularly, when the surroundings are dark, the reflected light L2a reflected by the reflecting portion WS may be easily viewed, thereby obstructing the user's view.

However, according to the display device according to an embodiment, since the plurality of anti-reflection layers 720 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365 are included, the second light L2 emitted from the emission layer 370 toward the third surface U of the display device 100 may be blocked (and/or refracted/reflected) by the anti-reflection layer 720. Accordingly, it is possible to prevent the reflected light from being viewed by the user by being reflected by the reflecting portion WS that is inclined to form a predetermined angle with the third direction DR3 at the third surface U side of the display device 100.

Similar to the first light L1 emitted from the emission layer 370 toward the third direction DR3, the third light L3 emitted from the emission layer 370 toward the fourth surface D of the display device 100 may be emitted to the outside of the display device. When the anti-reflection layer 720 is formed to surround all the edges of the emission layer 370, the third light L3 emitted toward the fourth surface D of the display device 100 may also be blocked by the anti-reflection layer 720 to not be emitted to the outside of the display device, so that transmittance of the display device may be deteriorated. Similarly, light emitted from the emission layer 370 toward the first surface L or toward the second surface R may also not be emitted to the outside of the display device, and thus the transmittance of the display device may be deteriorated.

However, according to the display device according to an embodiment, in a plan view, since the anti-reflection layer 720 of the anti-reflection portion 700 may be disposed so as to overlap the pixel defining layer 350 along the edge disposed at the third surface U side of the display device 100 among the edges of the pixel opening 365, the second light L2 emitted from the emission layer 370 toward the third surface U of the display device 100 is blocked (and/or reflected/refracted) by the anti-reflection layer 720, while the third light L3 emitted in a direction toward the fourth surface D of the display device 100 may be emitted to the outside of the display device, thereby preventing a decrease in transmittance of the display device. Similarly, the light emitted from the emission layer 370 toward the first surface L or toward the second surface R may also not be blocked to be emitted to the outside of the display device, thereby preventing a decrease in transmittance of the display device.

According to the display device according to an embodiment, since the anti-reflection layer 720 overlapping a portion of the pixel defining layer 350 that does not display an image is formed, a manufacturing cost is not increased and the entire transmittance of the display device is not deteriorated.

Figure 5:
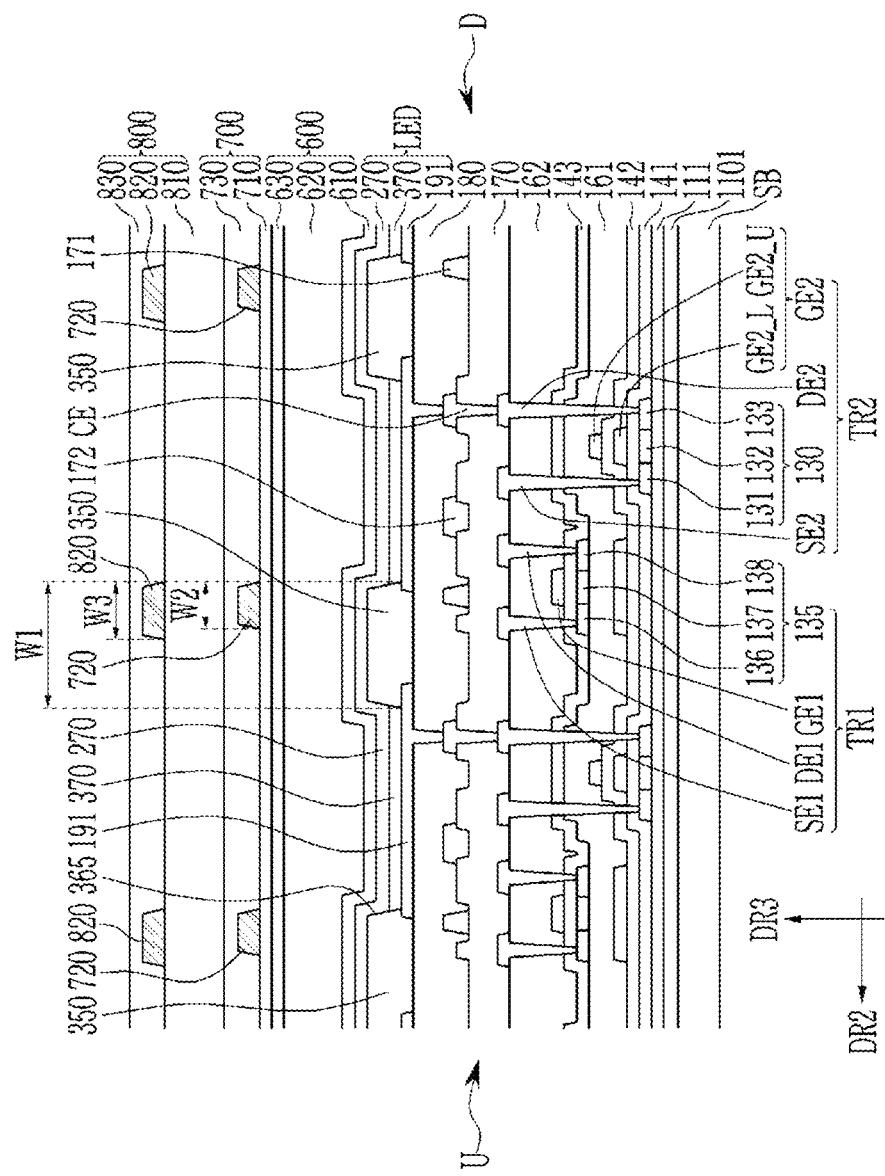
FIG. 5 illustrates a cross-sectional view of a display device according to another embodiment.
Figure 6:
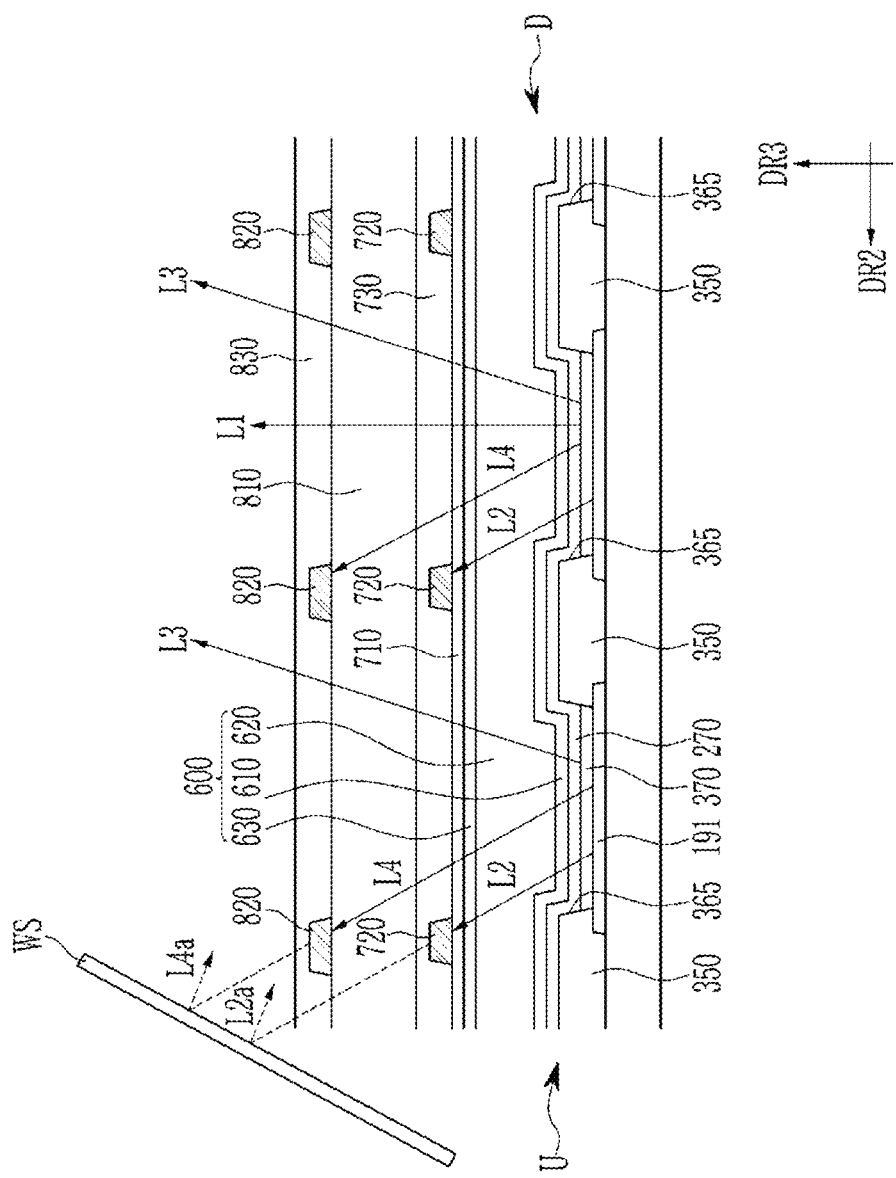
FIG. 6 illustrates a cross-sectional view for explaining a light path of a display device according to another embodiment.

Hereinafter, a display device according to another embodiment will be described with reference to FIG. 5 and FIG. 6. FIG. 5 illustrates a cross-sectional view of a display device according to another embodiment, and FIG. 6 illustrates a cross-sectional view for explaining a light path of a display device according to another embodiment.

Referring to FIG. 5, the display device according to the embodiment shown in that figure is similar to the display device according to the above-described embodiment. Detailed description of the same constituent elements will be omitted for ease in explanation of this embodiment.

Referring to FIG. 5, in the display device according to an embodiment, similar to the display device according to the above-described embodiment, the anti-reflection portion 700 may be disposed on the encapsulation layer 600. In addition, the display device according to the embodiment further includes a first anti-reflection portion 800 disposed on the anti-reflection portion 700, unlike the display device according to the above-described embodiment.

The first anti-reflection portion 800 may include a third layer 810 disposed on the anti-reflection portion 700, a plurality of first anti-reflection layers 820 disposed on the third layer 810, and a fourth layer 830 disposed on the plurality of first anti-reflection layers 820.

A thickness measured along the third direction DR3 of the third layer 810 of the first anti-reflection portion 800 may be thicker than that measured along the third direction DR3 of the first layer 710 of the anti-reflection portion 700. The third layer 810 of the first anti-reflection portion 800 may be an organic/inorganic insulating layer, an adhesive layer, or the like, but is not limited thereto.

The first anti-reflection layer 820 of the first anti-reflection portion 800 may block and/or reflect/refract light. For example, the first anti-reflection layer 820 of the first anti-reflection portion 800 may include black color pigments, and may absorb incident light to prevent it from being emitted to the outside.

The anti-reflection layer 720 of the anti-reflection portion 700 may overlap a portion of the pixel defining layer 350 along the third direction DR3 perpendicular to the surface of the substrate SB, and the anti-reflection layer 720 of the anti-reflection portion 700 may overlap the first anti-reflection layer 820 of the first anti-reflection portion 800. The second width W2 measured along the second direction DR2 of the anti-reflection layer 720 may be smaller than the first width W1 measured along the second direction DR2 of the pixel defining layer 350 disposed between the two pixel openings 365 adjacent to each other along the second direction DR2, and a third width W3 of the first anti-reflection layer 820 measured along the second direction DR2 may be smaller than the first width W1. The third width W3 of the first anti-reflection layer 820 measured along the second direction DR2 may be substantially equal to or larger than the second width W2 of the anti-reflection layer 720 measured along the second direction DR2.

As described above with reference to FIG. 1, in a plan view, the anti-reflection layer 720 of the anti-reflection portion 700 may be disposed along the edge disposed at the third surface U side of the display device 100 at which the reflecting portion WS is disposed among the edges of the pixel opening 365, and similarly, the first anti-reflection layer 820 of the first anti-reflection portion 800 may also be disposed along the edge disposed at the third surface U side of the display device 100 at which the reflecting portion WS is disposed among the edges of the pixel opening 365.

In a plan view, the anti-reflection layer 720 and the first anti-reflection layer 820 may not be disposed at a portion adjacent to the edge disposed at the fourth surface D side of the display device 100 among the edges of the pixel opening 365, and similarly, the anti-reflection layer 720 and the first anti-reflection layer 820 may not be disposed at a portion adjacent to the edge disposed at the first surface L side and the second surface R side of the display device 100 among the edges of the pixel opening 365.

Referring to FIG. 6, the first light L1 emitted from the emission layer 370 toward the third direction DR3 is emitted to the outside of the display device, while the second light L2 emitted from the emission layer 370 toward the third surface U of the display device 100 in which the reflecting portion WS is disposed may be at least partially blocked by the anti-reflection layer 720 to not be emitted to the outside of the display device.

Similar to the first light L1 emitted from the emission layer 370 toward the third direction DR3, the second light L2 emitted from the emission layer 370 toward the fourth surface D of the display device 100 may be emitted to the outside of the display device.

In addition, fourth light L4 that is not blocked by the anti-reflection layer 720 among the light emitted from the emission layer 370 toward the third surface U of the display device 100 in which the reflecting portion WS is disposed may be additionally blocked by the first anti-reflection layer 820 to not be emitted to the outside of the display device. As described above, since the display device according to the embodiment further includes a first anti-reflection portion 800 including the first anti-reflection layer 820 disposed on the anti-reflection portion 700 including the anti-reflection layer 720, it is possible to additionally block the light emitted from the emission layer 370 toward the third surface U of the display device 100 in which the reflecting portion WS is disposed.

By adjusting a thickness of the third layer 810 of the first anti-reflection portion 800, a range of light that may be blocked by the first anti-reflection layer 820 of the first anti-reflection portion 800 may be changed. The thickness of the third layer 810 of the first anti-reflection portion 800 may be set in consideration of the range of light that may be blocked by the first anti-reflection layer 820 and the entire transmittance change according to the third layer 810.

According to the display device according to an embodiment, since the plurality of anti-reflection layers 720 and the plurality of first anti-reflection layers 820 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365 are included, the second light L2 emitted from the emission layer 370 toward the third surface U of the display device 100 in which the reflecting portion WS is disposed may be blocked (and/or refracted/reflected) by the anti-reflection layer 720 and the plurality of first anti-reflection layers 820. Accordingly, it is possible to prevent the reflected light from being viewed by the user by being reflected by the reflecting portion WS that is inclined to form a predetermined angle with the third direction DR3 at the third surface U side of the display device 100 at which the reflecting portion WS is disposed.

Most features of the display device according to the embodiment described above with reference to FIG. 1 to FIG. 4 are substantially applicable to the display device according to the embodiment.

Figure 7:
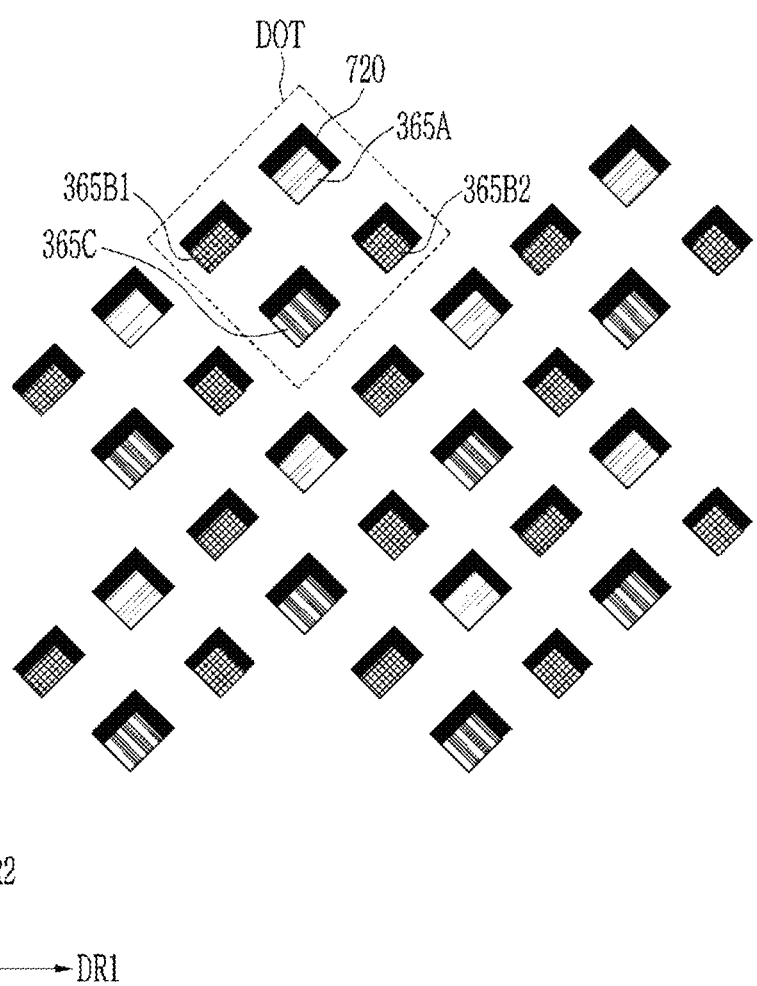
FIG. 7 illustrates a layout view of a display device according to another embodiment.

Hereinafter, a display device according to another embodiment will be described with reference to FIG. 7. FIG. 7 illustrates a layout view of a display device according to another embodiment.

Referring to FIG. 7, the display device according to the embodiment includes a plurality of dots DOT including one first pixel opening 365A, two second pixel openings 365B1 and 365B2, and one third pixel opening 365C. However, unlike as shown, each dot DOT may include various numbers of pixel openings.

Two second pixel openings 365B1 and 365B2 may be repeatedly disposed along the first direction DR1 and the second direction DR2, and one first pixel opening 365A and one third pixel opening 365C may be repeatedly disposed along the first direction DR1 and the second direction DR2. In addition, two second pixel openings 365B1 and 365B2, one first pixel opening 365A, and one third pixel opening 365C may be alternately disposed along the first direction DR1 and the second direction DR2.

The display device according to the embodiment includes the plurality of anti-reflection layers 720. The plurality of anti-reflection layer 720 may be disposed so as to overlap a portion of the pixel defining layer 350, and may be disposed along an edge disposed at the third surface U side of the display device 100 at which the reflecting portion WS is disposed among edges of the plurality of pixel openings 365A, 365B1, 365B2, and 365C.

In addition, although not shown, the display device according to the embodiment may further include the plurality of first anti-reflection layers 820 that are disposed to overlap the plurality of anti-reflection layers 720.

As described above, since the display device according to the embodiment includes the plurality of anti-reflection layers 720 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365, the second light L2 emitted from the emission layer 370 toward the third surface U of the display device 100 in which the reflecting portion WS is disposed is blocked by the anti-reflection layer 720 to not be emitted to the outside, and thus, it is possible to prevent the reflected light from being viewed by the user by being reflected by the reflecting portion WS that is inclined to form a predetermined angle with the third direction DR3 at the third surface U side of the display device 100. In addition, light emitted from the emission layer 370 to a direction other than the third surface U side of the display device 100 at which the reflecting portion WS is disposed is not blocked by the plurality of anti-reflection layers 720 to be emitted to the outside of the display device, thereby preventing the transmittance of the display device from deteriorating.

Most features of the display device according to the embodiment described above with reference to FIG. 1 to FIG. 6 are substantially applicable to the display device according to an embodiment.

Figure 8:
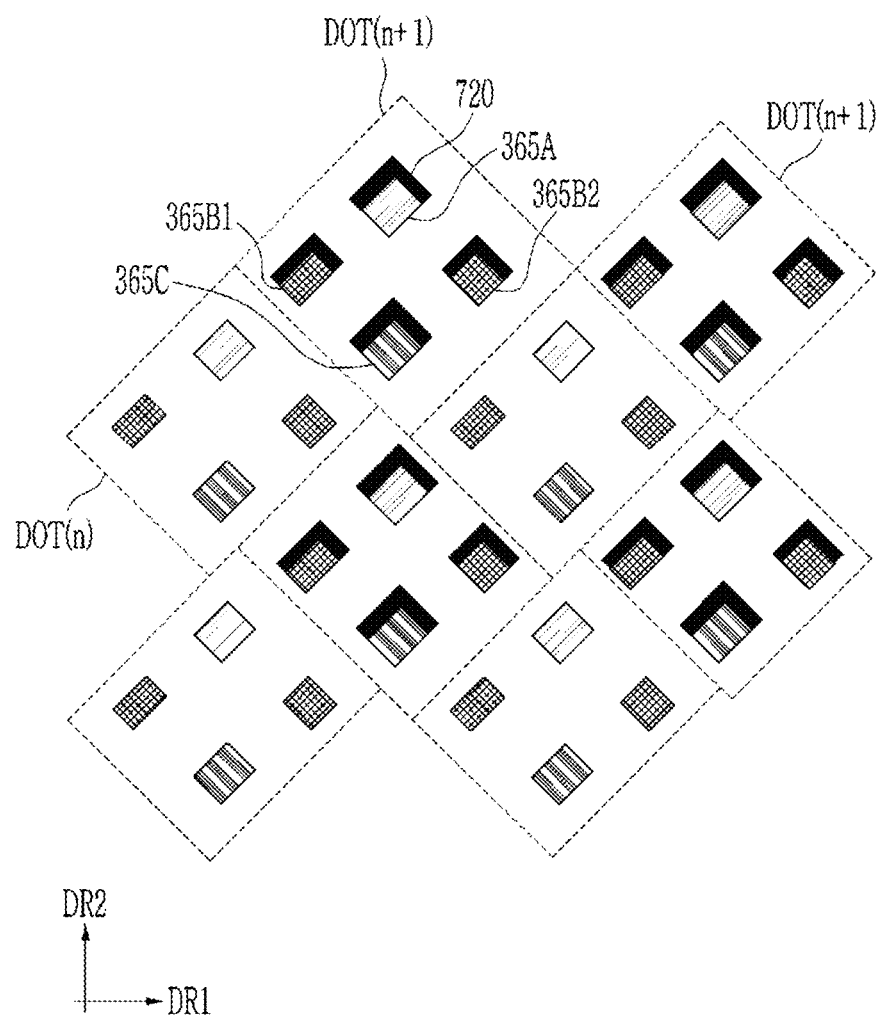
FIG. 8 illustrates a layout view of a display device according to another embodiment.

Hereinafter, a display device according to another embodiment will be described with reference to FIG. 8. FIG. 8 illustrates a layout view of a display device according to another embodiment.

Referring to FIG. 8, the display device according to the embodiment with reference to that figure is similar to the display device according to the embodiment described above with reference to FIG. 7.

The display device according to the embodiment includes a plurality of first dots DOT(n) and a plurality of second dots DOT(n+1) that include one first pixel opening 365A, two second pixel opening 365B1 and 365B2, and one third pixel opening 365C. However, unlike as illustrated, the plurality of first dots DOT(n) and the plurality of second dots DOT (n+1) may include different numbers of pixel openings.

Two second pixel openings 365B1 and 365B2 may be repeatedly disposed along the first direction DR1 and the second direction DR2, and one first pixel opening 365A and one third pixel opening 365C may be repeatedly disposed along the first direction DR1 and the second direction DR2. In addition, two second pixel openings 365B1 and 365B2, one first pixel opening 365A, and one third pixel opening 365C may be alternately disposed along the first direction DR1 and the second direction DR2.

The display device according to the embodiment includes the plurality of anti-reflection layers 720. The plurality of anti-reflection layers 720 may be disposed to overlap a portion of the pixel defining layer 350, and may be disposed along an edge disposed at the upper surface U side along the second direction DR2 among edges of the plurality of pixel openings 365A, 365B1, 365B2, and 365C included in the plurality of second dots DOT(n+1) among the plurality of first dots DOT(n) and the plurality of second dots DOT(n+1).

In addition, the display device according to the embodiment may further include the plurality of first anti-reflection layers 820 that are disposed to overlap the plurality of anti-reflection layers 720.

The anti-reflection layer 720 is not disposed around edges of the plurality of pixel openings 365A, 365B1, 365B2, and 365C included in the plurality of first dots DOT(n) among the plurality of first dots DOT(n) and the plurality of second dots DOT(n+1).

The plurality of first dots DOT(n) and the plurality of second dots DOT(n+1) may be disposed in a line along the second direction DR2, respectively, and the plurality of first dots DOT(n) and the plurality of second dots DOT(n+1) may be alternately disposed along the first direction DR1.

When the light reflected by the reflecting portion WS is not viewed by the user because the surroundings are not dark, both the plurality of first dots DOT(n) and the plurality of second dots DOT(n+1) may emit light, while when the light reflected by the reflecting portion WS is viewed by the user because the surroundings are dark, only the plurality of second dots DOT(n+1) including the plurality of anti-reflection layers 720 emit light, so that when the user views the display device, it is possible to prevent the reflected light from being viewed by the user by being reflected by the reflecting portion WS that is inclined to form a predetermined angle with the third direction DR3 at the upper surface U side.

In addition, similar to the display device according to the above-described embodiment, since the display device according to one or more embodiments includes the plurality of anti-reflection layers 720 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365, the second light L2 emitted from the emission layer 370 toward the third surface U of the display device 100 in which the reflecting portion WS is disposed is blocked by the anti-reflection layer 720 to not be emitted to the outside, and thus, it is possible to prevent the reflected light from being viewed by the user by being reflected by the reflecting portion WS that is inclined to form a predetermined angle with the third direction DR3 at the third surface U side of the display device 100. In addition, the light emitted from the emission layer 370 to a direction other than the third surface U of the display device 100 in which the reflecting portion WS is disposed is not blocked by the plurality of anti-reflection layers 720 to be emitted to the outside of the display device, thereby preventing the transmittance of the display device from deteriorating.

Most features of the display device according to the embodiment described above with reference to FIG. 1 to FIG. 7 are substantially applicable to the display device according to an embodiment.

Figure 9:
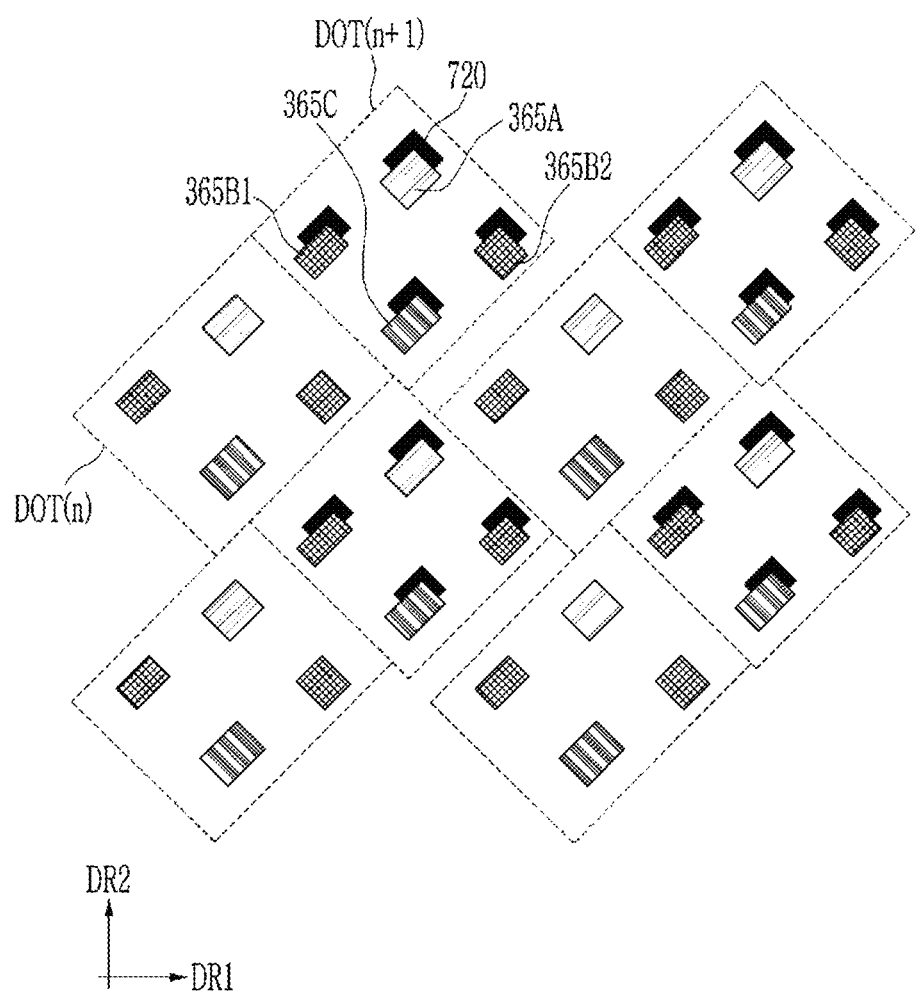
FIG. 9 illustrates a layout view of a display device according to another embodiment.

Hereinafter, a display device according to another embodiment will be described with reference to FIG. 9. FIG. 9 illustrates a layout view of a display device according to another embodiment.

Referring to FIG. 9, the display device according to an embodiment is similar to the display device according to the embodiment described above with reference to FIG. 8. Detailed description of the same constituent elements will be omitted for ease in explanation of this embodiment.

Unlike the display device according to the embodiment shown in FIG. 8, in the display device according to the embodiment, the plurality of anti-reflection layers 720 are disposed along a portion of the edge disposed at the third surface U side of the display device 100 at which the reflecting portion WS is disposed among the edges of the pixel opening 365. Except for the positions of the plurality of anti-reflection layers 720, the display device according to the embodiment according to FIG. 9 is the same as the display device according to the embodiment shown in FIG. 7.

The plurality of anti-reflection layers 720 may not be disposed at the plurality of first dots DOT(n), while the plurality of anti-reflection layers 720 may be disposed at the plurality of second dots DOT(n+1).

When the light reflected by the reflecting portion WS is not viewed by the user because the surroundings are not dark, both the plurality of first dots DOT(n) and the plurality of second dots DOT(n+1) may emit light, while when the light reflected by the reflecting portion WS is viewed by the user because the surroundings are dark, only the plurality of second dots DOT(n+1) including the plurality of anti-reflection layers 720 emit light, so that when the user views the display device, it is possible to prevent the reflected light from being viewed by the user by being reflected by the reflecting portion WS that is inclined to form a predetermined angle with the third direction DR3 at the upper surface U side.

In addition, similar to the display device according to the above-described embodiment, since the display device according to the embodiment described herein includes the plurality of anti-reflection layers 720 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365, the second light L2 emitted from the emission layer 370 toward the third surface U of the display device 100 in which the reflecting portion WS is disposed is blocked by the anti-reflection layer 720 to not be emitted to the outside, and thus, it is possible to prevent the reflected light from being viewed by the user by being reflected by the reflecting portion WS that is inclined to form a predetermined angle with the third direction DR3 at the third surface U side of the display device 100. In addition, the light emitted from the emission layer 370 to a direction other than the third surface U of the display device 100 in which the reflecting portion WS is disposed is not blocked by the plurality of anti-reflection layers 720 to be emitted to the outside of the display device, thereby preventing the transmittance of the display device from deteriorating.

Most features of the display device according to the embodiment described above with reference to FIG. 1 to FIG. 8 are substantially applicable to the display device according to an embodiment.

Figure 10:
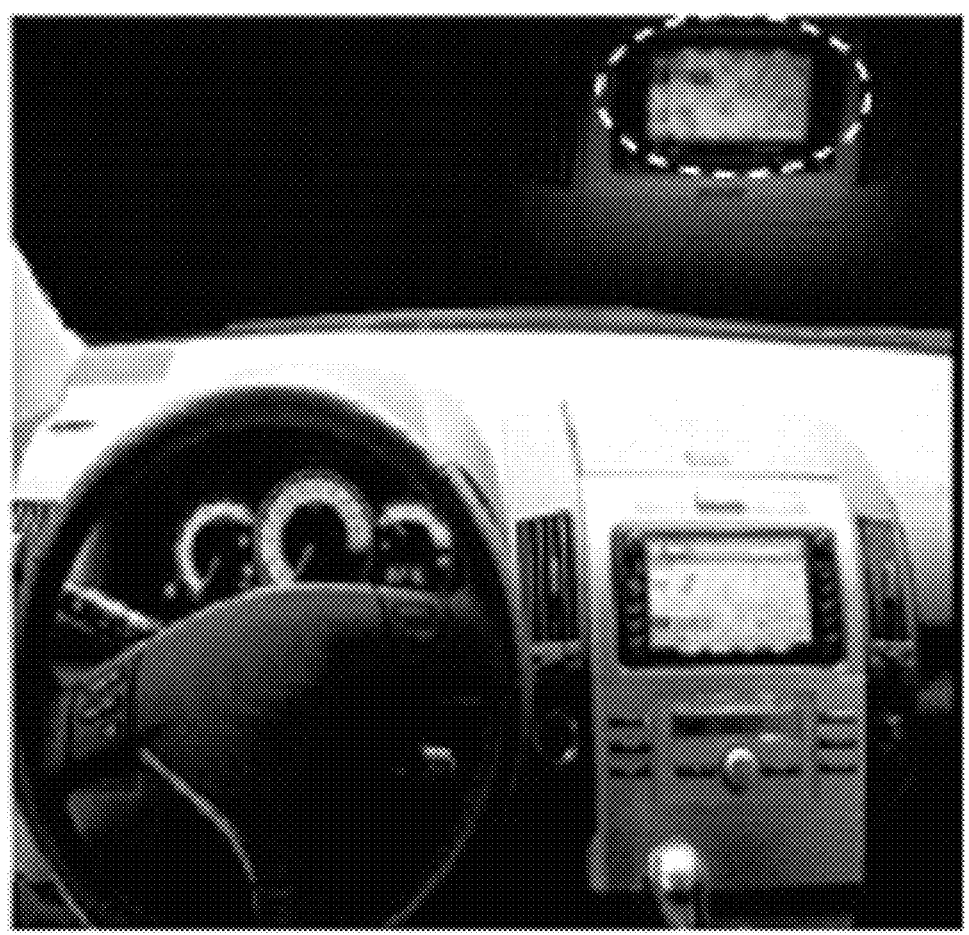
FIG. 10 and FIG. 11 illustrate images of results of an experimental example.
Figure 11:

Hereinafter, an experimental example will be described with reference to FIG. 10 and FIG. 11. FIG. 10 and FIG. 11 illustrate images of results of an experimental example.

FIG. 10 illustrates an image when a display device not including the plurality of anti-reflection layers 720 is installed in a vehicle, and FIG. 11 illustrates an image when a display device including the plurality of anti-reflection layers 720 is installed in a vehicle.

Referring to FIG. 10, it can be seen that when the display device that does not include the plurality of anti-reflection layers 720 is installed in the vehicle, the light emitted from the display device is reflected by the windshield, which is a reflecting portion disposed at the third surface U side of the display device 100, and the reflected light is viewed by the user.

However, referring to FIG. 11, as in the display device according to the embodiments, according to the display device including the plurality of anti-reflection layers 720 that overlap a portion of the pixel defining layer 350 along the third direction DR3 perpendicular to the surface of the substrate SB and are disposed along the edge disposed at the third surface U side of the display device 100 at which the reflecting portion WS is disposed among the edges of the pixel opening 365, it can be seen that the light emitted from the display device is not reflected by the windshield, which is a reflecting portion disposed at the third surface U side of the display device 100, so that the reflected light may be prevented from being unnecessarily viewed by the user.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a pixel defining layer disposed on the substrate and that includes a pixel opening;
   an emission layer that overlaps the pixel opening of the pixel defining layer; and
   an anti-reflection layer that overlaps a portion of the pixel defining layer along a direction perpendicular to a surface of the substrate and is disposed along a portion of an edge of the pixel opening.

2. The display device of claim 1, wherein
   the anti-reflection layer is disposed in a first direction with respect to the pixel opening, and
   the anti-reflection layer is not disposed in a second direction opposite to the first direction with respect to the pixel opening.

3. The display device of claim 2, wherein
   the pixel defining layer includes a plurality of pixel openings,
   a second width of the anti-reflection layer is smaller than a first width of the pixel defining layer between two adjacent pixel openings among the plurality of the pixel openings, along a direction parallel to the first direction, and
   a width of the anti-reflection layer is substantially equal to or smaller than a width of the pixel openings, along a third direction crossing the first direction.

4. The display device of claim 2, wherein
   light emitted from the emission layer toward the first direction is blocked by the anti-reflection layer to not be emitted to outside of the display device.

5. The display device of claim 4, wherein
   light emitted from the emission layer toward the second direction is not blocked by the anti-reflection layer to be emitted to the outside of the display device.

6. The display device of claim 5, further comprising
   a first anti-reflection layer that overlaps the anti-reflection layer along a direction perpendicular to the surface of the substrate and is disposed along the portion of the edge of the pixel opening.

7. The display device of claim 6, wherein
   a first portion of the light emitted from the emission layer toward the first direction is blocked by the anti-reflection layer to not be emitted to the outside of the display device, and
   a second portion of the light emitted from the emission layer toward the first direction is not blocked by the anti-reflection layer, but is blocked by the first anti-reflection layer to not be emitted to the outside of the display device.

8. The display device of claim 2, further comprising:
   a transistor disposed on the substrate;
   a pixel electrode connected to the transistor and disposed under the pixel defining layer;
   a common electrode disposed on the emission layer; and
   an encapsulation layer disposed on the common electrode,
   wherein the anti-reflection layer is disposed on the encapsulation layer.

9. The display device of claim 8, further comprising
   a first anti-reflection layer that is disposed on the anti-reflection layer, the first anti-reflection layer overlaps the anti-reflection layer along the direction perpendicular to the surface of the substrate, and the first anti-reflection layer is disposed along the portion of the edge of the pixel opening.

10. The display device of claim 9, further comprising:
    a first layer disposed between the encapsulation layer and the anti-reflection layer;
    a second layer disposed on the anti-reflection layer; and
    a third layer disposed between the second layer and the first anti-reflection layer,
    wherein a thickness of the third layer measured along the direction perpendicular to the surface of the substrate is thicker than a thickness of the first layer measured along the direction perpendicular to the surface of the substrate.

11. The display device of claim 9, wherein
    along a direction parallel to the first direction, a second width of the anti-reflection layer and a third width of the first anti-reflection layer are smaller than a first width of the pixel defining layer.

12. The display device of claim 11, wherein
    the second width and the third width are the same, or the third width is larger than the second width.

13. A display device comprising:
    a first pixel group that includes a plurality of pixel openings, a plurality of emission layers that overlap the plurality of pixel openings, and a plurality of anti-reflection layers disposed along a portion of an edge of each of the plurality of pixel openings; and
    a second pixel group that includes the plurality of pixel openings and the plurality of emission layers that overlap the plurality of pixel openings, but does not includes the plurality of anti-reflection layers,
    wherein the first pixel group and the second pixel group are alternately disposed along a first direction.

14. The display device of claim 13, wherein
    both the plurality of emission layers of the first pixel group and the plurality of emission layers of the second pixel group emit light in a first case, and
    the plurality of emission layers of the first pixel group emit light in a second case, and the plurality of emission layers of the second pixel group do not emit light in the second case.

15. The display device of claim 14, wherein
    surroundings of the display device are darker in the second case than in the first case.

16. The display device of claim 13, wherein
    the plurality of anti-reflection layers are disposed in the first direction with respect to the pixel openings, and the anti-reflection layers are not disposed in a second direction opposite to the first direction with respect to the pixel openings.

17. The display device of claim 16, wherein
    a second width of the anti-reflection layer disposed between two adjacent pixel openings among the plurality of pixel openings is smaller than a first width of a pixel defining layer between the two adjacent pixel openings, with respect to the first direction, and
    a width of the anti-reflection layer is substantially equal to or smaller than a width of the pixel opening, along a third direction crossing the first direction.

18. The display device of claim 16, wherein
    light emitted from the plurality of emission layers toward the first direction is blocked by the plurality of anti-reflection layers to not be emitted to outside of the display device.

19. The display device of claim 18, wherein
light emitted from the plurality of emission layers toward the second direction is not blocked by the plurality of anti-reflection layers to be emitted to the outside of the display device.

20. The display device of claim 16, wherein
the first pixel group further includes a plurality of first anti-reflection layers that overlap the plurality of anti-reflection layers.

* * * * *